United States Patent
Holder et al.

(10) Patent No.: US 7,523,291 B2
(45) Date of Patent: Apr. 21, 2009

(54) SYSTEM AND METHOD FOR TESTING FOR MEMORY ADDRESS ALIASING ERRORS

(75) Inventors: William A. Holder, Vestal, NY (US);
Damian L. Osisek, Vestal, NY (US);
Thomas M. Vail, Owego, NY (US);
Donald P. Wilton, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 11/190,710

(22) Filed: Jul. 26, 2005

(65) Prior Publication Data
US 2007/0028075 A1    Feb. 1, 2007

(51) Int. Cl.
*G06F 13/00* (2006.01)
(52) U.S. Cl. .................. 711/210; 711/202; 711/209
(58) Field of Classification Search ........... 711/202, 711/209, 210
See application file for complete search history.

(56) References Cited

U.S. PATENT DOCUMENTS

| | | | |
|---|---|---|---|
| 5,230,069 A | 7/1993 | Breisford et al. | 395/400 |
| 5,555,385 A | 9/1996 | Osisek | 395/401 |
| 5,765,198 A * | 6/1998 | McCrocklin et al. | 711/165 |
| 2003/0046294 A1* | 3/2003 | Heronimus | 707/100 |

OTHER PUBLICATIONS

Love, Robert, *Linux Kernel Development.* Sams Publishing, Indianapolis, Indiana. Chapter 10 Memory Management, pp. 182-184.
IBM Corporation. *CP Command and Utility Reference,* Version 3 Release 1.0. IBM Publication SC24-5967-00, Feb. 2001, pp. 174-178 (Define Storage Command).
IBM Corporation. *Enterprise Systems Architecture/390 Principles of Operation.* IBM Publication SA22-7201-08, 2003, pp. iii-xv, 1-9, 2-2 to 2-5, 3-1 to 3-8, 4-6, 5-8, 7-117 to 7-118.
IBM Corporation. *z/Architecture Principles of Operation.* IBM Publication SA22-7832-02, 2003, pp. iii-xv, 1-2, 1-5, 1-10, 1-17, 2-2 to 2-3, 3-1 to 3-7, 3-26 to 3-62, 4-6 to 4-7, 5-7 to 5-8, 7-161to 7-162.

* cited by examiner

*Primary Examiner*—Reba I. Elmore
(74) *Attorney, Agent, or Firm*—Arthur J. Samodovitz

(57) ABSTRACT

Aliasing errors, occasioned by, for example, a programming error resulting in including extra or missing bits in a storage address, wrong addressing mode, or wrong address context, are detected by providing a storage address configuration including gaps in valid addresses. Such a programming error is detected and an exception is thrown (that is, an addressing error is detected and indicated) responsive to an address reference to such a gap in valid addresses. Gaps are configured at complementary address ranges to facilitate detection of such aliasing errors.

17 Claims, 8 Drawing Sheets

SYSTEM AND METHOD FOR TESTING FOR MEMORY ADDRESS ALIASING ERRORS

CROSS REFERENCES TO RELATED APPLICATIONS

U.S. patent application Ser. No. 11/190,224 entitled "SYSTEM AND METHOD FOR ALIAS MAPPING OF ADDRESS SPACE" filed concurrently herewith is assigned to the same assignee hereof and contains subject matter related, in certain respects, to the subject matter of the present application. The above identified patent application is incorporated herein by reference.

BACKGROUND OF THE INVENTION

1. Technical Field of the Invention

This invention relates to program addressability testing. More particularly, it relates to testing for memory aliasing errors in systems with large and small addresses or with addresses in different address spaces.

2. Background Art

In computer systems with large amounts of storage relative to the storage amounts formerly expected, or registers extended to be larger than formerly expected, a common bug is for code to have less-significant bits correct in a storage reference but have incorrect values for the most-significant bits.

Equivalently, registers employed for indirect addressing may be loaded with incorrect values, resulting in a final address location with incorrect most-significant bits.

Referring to FIG. 1, for example, coding or usage errors occur when code using a 31-bit address 106 is used in a 64-bit system, giving rise to missing or extra bits or wrong mode. A second addressing scheme implements a 31-bit address 106 in a 32-bit register 104 (including mode bit 103), with the extra bit (mode bit 103) used to distinguish older, first 24 bit addresses from the newer 31-bit addresses 106. In a third addressing scheme, a 64-bit address 108 is implemented in a 64-bit register 100. In a system built on this third addressing scheme, programs may switch back and forth between addressing modes. This system has 64-bit registers 100, but instructions are provided for switching between 31- and 64-bit addressing modes, using 31- and 64-bit addresses 106, 108, respectively.

In this third context, programs based on 31-bit addressing are upgraded to 64-bit programs using routines built on such instructions as set addressing mode (SAM; for example, SAM31, SAM64). Similarly, addressing mode may be set using load program status word (load PSW), branch and set mode, and branch and set save mode. These instructions, addressing modes and related structures, and other commands referenced hereafter, are described in the following IBM publications.

IBM Corporation. *z/VM CP Command and Utility Reference, Version* 3 *Release* 1.0. IBM Publication SC24-5967-00, February 2001, pages 174-178 (Define Storage Command).

IBM Corporation. *Enterprise Systems Architecture/*390 *Principles of Operation*. IBM Publication SA22-7201-08, 2003, pages iii-xv, 1-9, 2-2 to 2-5, 3-1 to 3-8, 4-6, 5-8, 7-117 to 7-118.

IBM Corporation. *z/Architecture Principles of Operation*. IBM Publication SA22-7832-02, 2003, pages iii-xv, 1-2, 1-5, 1-10, 1-17, 2-2 to 2-3, 3-1 to 3-7, 3-26 to 3-62, 4-6 to 4-7, 5-7 to 5-8, 7-161 to 7-162.

Typical problems which occur as a result of switching addressing modes include having bits off that should be on, having bits on that should be off, or having the address be used in a wrong mode. This is caused, typically, when a programmer is using a mixture of 32-bit and 64-bit operations. If there is a coding error, that error may leave a persistent residue. Thus, for example, a program moving a 64-bit address 108 into a register 100 from memory (herein called storage) should use a LG instruction (load G, where G represents a 64-bit object). However, if the program uses a simple load, only the right half 104 (including mode bit 103) of the register 100 is loaded from storage, and the register's left half 102 is left with whatever data was present before the load instruction.

In another case, the program may assume the high-order 33 bits 109 of register 100 are all zeros, and if they are not, the unintended residue in the high-order 33 bits 109 may be passed in an address to a routine expecting a clean 64-bit representation 108 of the intended 31-bit address 106, resulting in an addressing error.

In another aspect of this addressing problem, when propagating a 31-bit address into a 64-bit mode, with mode bit 103 used to differentiate between 24- and 31-bit addresses, bit 103 remains on in the high order 33 bits 109 of the 64-bit register and is used as part of the 64-bit address when, in the 31-bit mode, it is not part of the address. Thus, the programmer must distinguish a 31-bit address 106 from a 32-bit value (bits 32-63, or 32 bits).

The inverse of the above typical problems also occurs. In this case, code using a 64-bit address 108 which is beyond addressability of a 31-bit address 106 (that is, whose high order 33 bits 109 are not zeros) may erroneously pass that address to code which only tolerates 31-bit addresses. The latter code will then make references in 31-bit addressing mode, ignoring the high-order 33 bits 109 and therefore referencing the wrong memory location.

Referring to FIG. 2 in connection with FIG. 1, a program in 64-bit addressing mode attempting to access a storage location 110 by way of a 31-bit address 106 may, if the mode bit 103 is on, actually access storage location 112. Similarly, a program in 64-bit addressing mode attempting to access a storage location 110 by way of a 31-bit address 106 may, if residual bits in the left half 102 are nonzero, actually access storage at a location like location 115. This could work the other way. That is, a program attempting to access storage location 112 by use of a 64-bit address 108 may, if bit 32 is off, access storage location 110.

Referring further to FIGS. 1 and 2, a bit error may occur in the left half 102. If a bit is lost, in an address 108 for location 114 in storage 120, the program may erroneously access location 116. Or, if in 31-bit mode (analogous to losing high order 33 bits 109) the program may access location 118, when location 114 is really the desired location. Similarly, if the program is operating with a 31-bit address 106 in 64-bit mode, if there is noise in high order address bits 109, the program may erroneously access location 114 in high region 122 when location 118 in low region 124 of storage 120 is desired.

In general, depending upon extra and missing bits in an address, program access to storage 120 may be erroneously directed. This is what is generally meant by an aliasing error.

The problems in the art addressed thus far relate to a single address space 120. However, if several virtual address spaces are in use, or if both real and virtual address spaces are in use, with control register settings or other means used to identify which address space is currently referenced, there is the possibility that the wrong virtual or real address space may be referenced.

There is, therefore, a need in the art for a system and method for testing program code to identify and locate addressing errors, including extra or missing bits and wrong addressing mode. There is a further need in the art to find in a program undergoing test addressing errors across multiple real and virtual address spaces. Heretofore, recognizing and locating the source of these errors so that they may be corrected in the code under test have been very difficult.

SUMMARY OF THE INVENTION

A system, method and program for detecting aliasing errors. A storage configuration with one or more address spaces including complementary gaps in valid addresses is configured, and an exception is thrown upon detecting a reference to an address within a gap.

Other features and advantages of this invention will become apparent from the following detailed description of the presently preferred embodiment of the invention, taken in conjunction with the accompanying drawings.

BEST MODE FOR CARRYING OUT THE INVENTION

In accordance with the present invention, in order to detect addressing errors, gaps are defined in storage for a second-level system (that is, the storage which is viewed as real storage to the second-level system). The DEFINE STORAGE CONFIG command of the IBM z/VM product may be used to define those gaps. Once a storage configuration with appropriate gaps is defined for a first-level virtual machine, a second-level operating system, such as a test instance of z/VM, is brought up in the virtual machine. To the second-level system, the real storage appears to have the specified gaps. The operating system of the second-level system then runs normally unless it illegally attempts to use storage from such a gap, in which instance a hardware exception is raised.

Hardware returns an exception if an erroneous (bad) alias address is used, that is, an aliasing error is detected.

An alias is an alternate label or name. In the present invention, an alias is an address in a storage context. An erroneous alias is an address of a given size that is interpreted in (that is, addresses) a wrong context, or addresses a wrong storage location within a context. This occurs when portions of a large address are truncated, resulting in addressing a storage location in a large region or extent with a small address. Also, this may occur when a small address in a large field or register is used to access a large address space. If the high portion of that large register, in which the low portion has been loaded with a small address, contains garbage (non address bits), this garbage is interpreted as part of the large address, resulting again in addressing a wrong page, section, region or extent. This is the sense in which "erroneous aliasing" is used in this description.

Erroneous aliasing includes using an address from one address space context in an incorrect address space context, which incorrect address space may be at storage address boundaries either larger or smaller than the correct address space. In accordance with the present invention, if an incorrect address is accessed, an immediate failure or exception is signaled from the hardware due to an attempt to reference an address in, or access, one of the above mentioned gaps.

Thus, in accordance with the present invention, these address space contexts are built so as to interleave valid address extents with gaps in a manner that aliasing errors will be detected. Stated otherwise, for example, 4 G worth of real storage may be defined in discontiguous extents, and 8 G of virtual storage addressability is built, for instance for a system execution space (SXS), by leaving gaps separating sections so as to create interleave for capturing erroneous addresses.

Thus, rather than test in a storage environment where all addresses are valid below a certain maximum value, gaps are used in the valid storage, and references to these gaps during test will be immediately identified as invalid.

Figure 1:
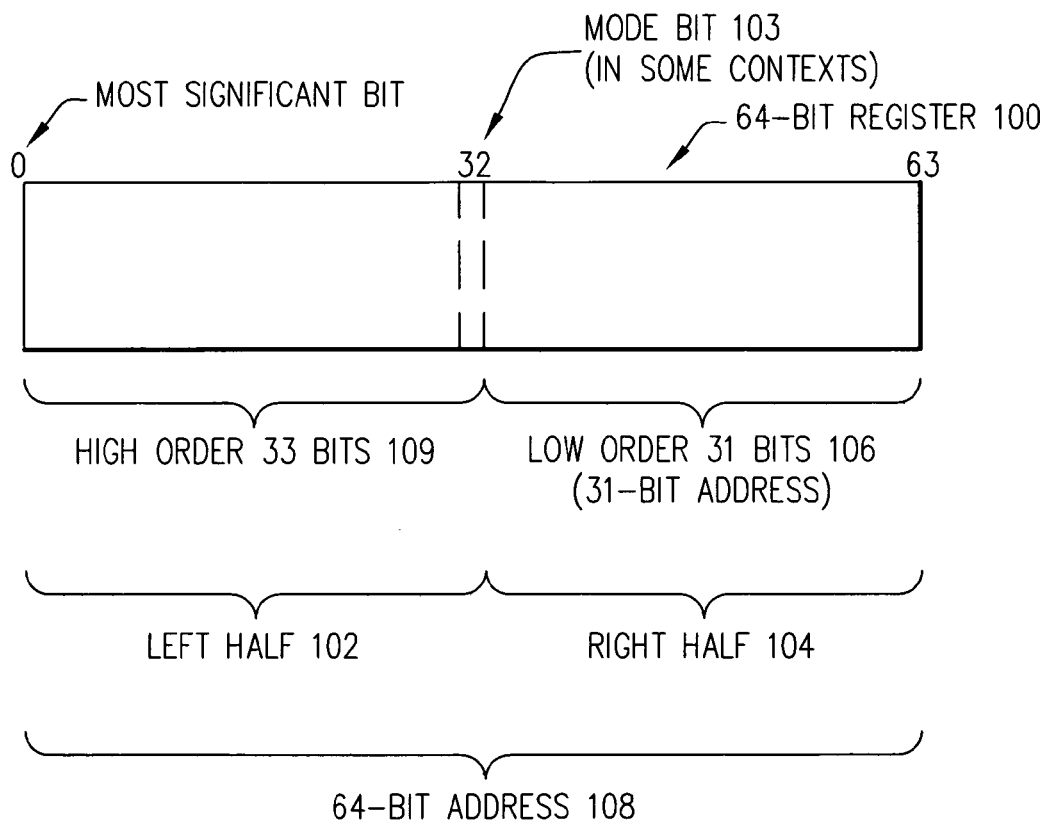
FIG. 1 is a diagrammatic illustration of 31-bit and 64-bit storage addressing modes in accordance with the prior art.
Figure 2:
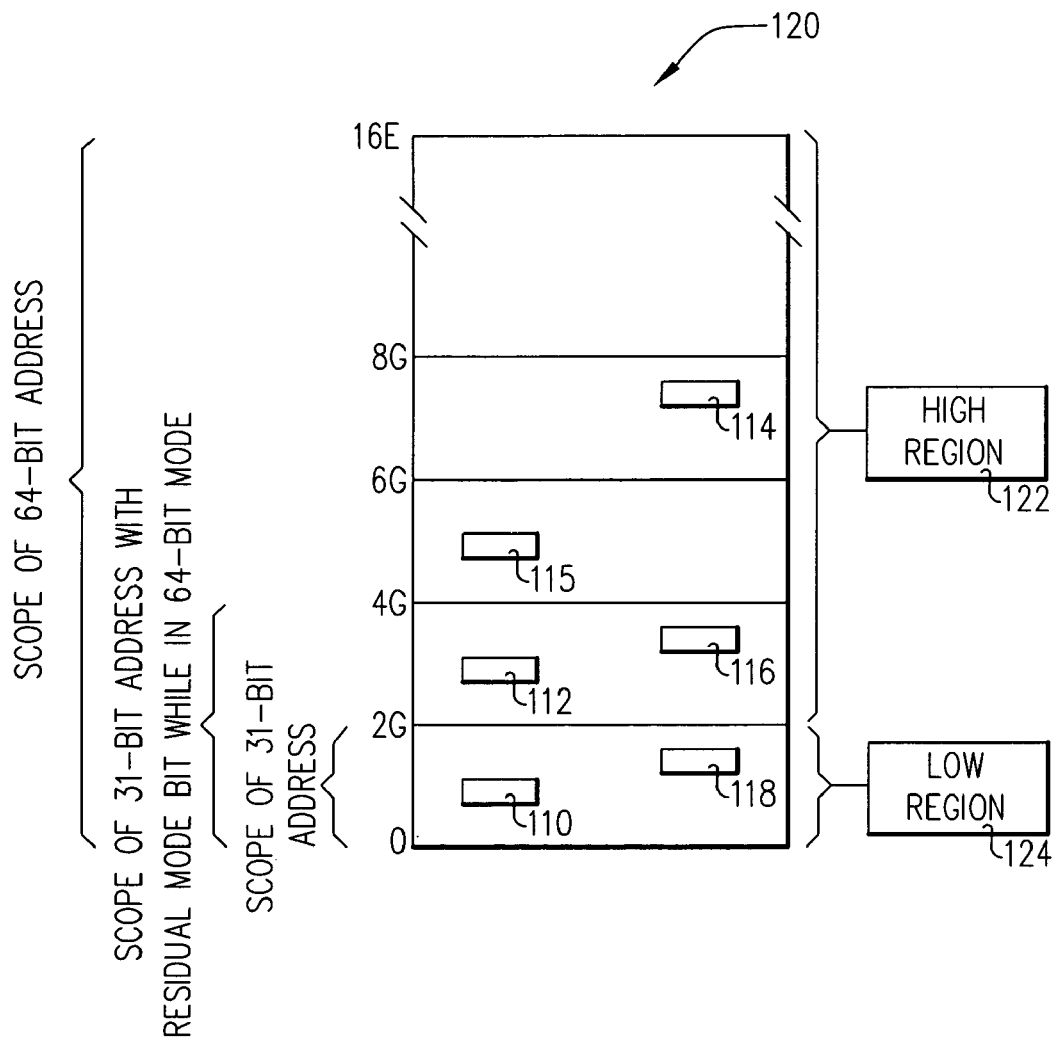
FIG. 2 is a diagrammatic illustration of a storage context illustrating addressing errors encountered in the prior art.
Figure 3:
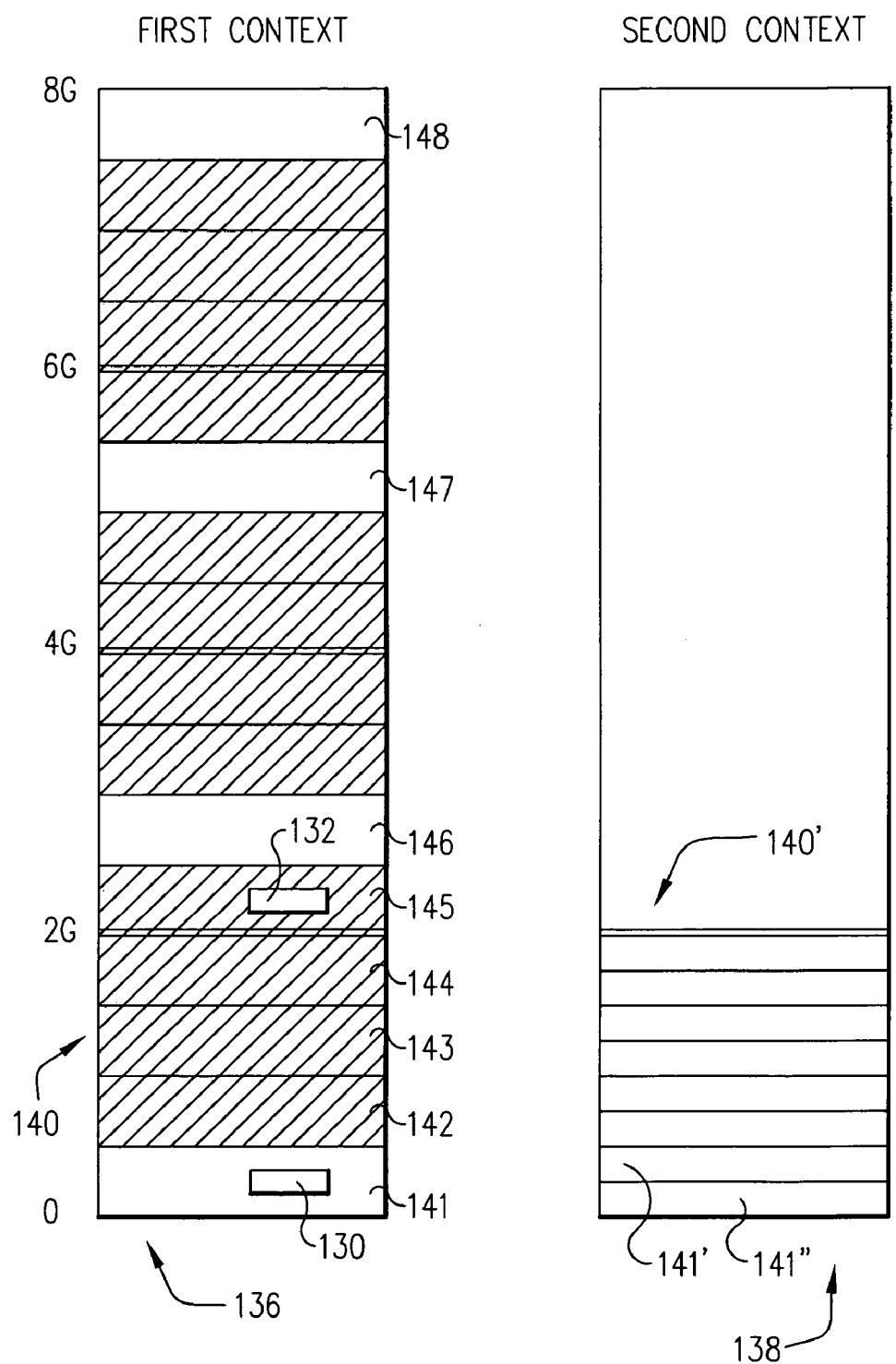
FIG. 3 is a diagrammatic representation of storage including first (in one example, real) and second (in one example, virtual) storage contexts.

Referring to FIG. 3, one address space 136 (illustrated with a size of 8 G) encompasses several locations, such as 130 and 132, the low-order 31 bits of whose addresses are identical. If this space 136 is divided into 2 G extents 140, as is illustrated, for purpose of determining whether the addressing of a program under test is correct, it is desired to have any pattern of 31 low-order bits which appears in a valid address 130 in any 2G extent not appear in any valid address of any other 2 G extent (for example, address 132). To do this, each 2 G extent is divided into N equal slices (in this example, N=4), with slices 141, 146, 147, and 148 representing valid addresses. The remaining slices are made to be invalid addresses, denoted by hatch marks in the figure. Thus, only slice 141 of extent 140 below 2 G is valid, only second slice 146 of the 2 G-4 G extent is valid, only third slice 147 of the 4 G-6 G extent is valid, and only fourth slice 148 of the 6 G-8 G extent is valid. The number of slices N into which each extent is divided is preferably the number of extents N in address space 136 being evaluated. If all four extents are being tested, then each extent would be divided into at least four slices in order to create one unique slice in each extent which is valid, with all other extents invalid, for the purpose of testing.

Thus, if any address 130 is intended to be valid in one extent, it will generate an invalid address (for example, the address of storage location 132) in any other extent if there are any missing or extra bits, or if wrong addressing mode is used. Low-order 31 bits 106 are common to all addressing modes, so that part of the address is chosen to be the unique identifier portion of the address.

Heretofore, incorrect storage references that are not caught and corrected during testing have been very difficult to find. By the present invention, catching and correcting these errors are made much easier.

In accordance with a preferred embodiment of the invention, a define storage configuration (DEF STOR CONFIG) command is used to make the first slice 141 of the first extent 140 valid, the second slice 146 of the second extent valid, the third slice 147 of the third extent valid, the fourth slice 148 of the fourth extent valid, and all other (the hatched out portions) slices invalid.

The DEF STOR CONFIG command (described hereafter in connection with FIG. 7) allows definition of non-contiguous storage ranges to appear real to a program being tested. In this example, each slice 141-148 is 512 megabytes. If the address containing certain low-order 31 bits selects a location 130 which is valid in first slice 141 of the first 2 G extent 140, then any other address containing those low-order 31 bits is invalid, since it would appear in the first slice of another 2 G extent, such as location 132 in first slice 145 of the second 2 G extent.

Referring further to FIG. 3, several address spaces or contexts may used in the system. Generally, the same address in different contexts may identify a different physical memory location. Illustrated are two contexts: first context 136 and second context 138. To detect references to an address 130, for instance, in the wrong context, if address location 130 is valid in first extent 140 of first context 136, it should be invalid in any first extent 140' of any other context 138. This may be accomplished by dividing each slice (such as slices 141-144 in first 2 G extent 140) in two to form two subslices (which may also be referred to as subdivisions) 141' and 141" for each slice 141 (for two contexts 136, 138, as illustrated) or by N for N contexts. If an address 130 is valid in the first subslice of slice 141 of context 136, it must be invalid in the first subslice 141" of context 138, and so on. An exception to this is the need for an identity mapped area, which will be described hereafter in connection with FIG. 6. An identity map may be provided to handle situations where an address is intended to be valid in both contexts 136 and 138, for instance mapping to the same underlying real storage. This may be accomplished by making the corresponding subslice valid in both contexts. (The term "subdivision" may refer to slices or subslices, depending upon the context.)

Figure 4:
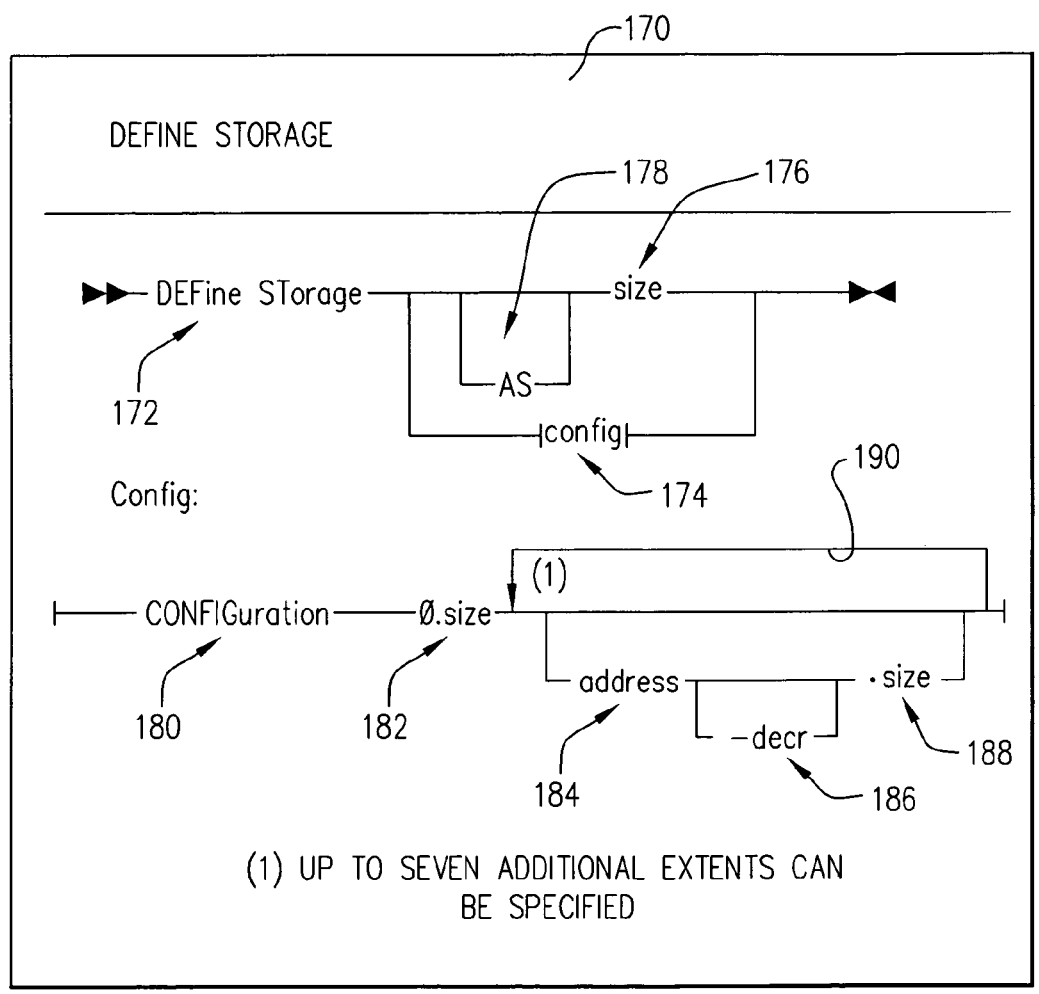
FIG. 4 is a diagrammatic representation of the define storage configuration (DEF STOR CONFIG) command used for configuring storage in accordance with the best mode embodiment of the invention.

Referring to FIG. 4, the syntax of the VM DEFINE STORAGE CONFIG command 170 is set forth. Its purpose, as described in the *z/VM CP Command and Utility Reference* document, supra, is to change the storage size and layout of a virtual machine, and its operands are as follows:

Size 176 is the size of the extent being defined by define storage (DEF ST) 172 when configuration (config) 174 is not specified. Size 176 is of the form nu, where n is a decimal number and u is the unit of measure, which may be K (kilobytes), M (megabytes), G (gigabytes), T (terabytes), P (petabytes), or E (exabytes).

Config 174 is an optional portion of the command, which if present, takes the form described by 180-188 in FIG. 4. Config 174 allows definition of multiple, non-contiguous storage extents by specifying a configuration keyword 180 with parameters 0.size 182 and up to seven address.size fields 182-188. (Arrow 190 indicates that the address.size field 182-188 may appear multiple times). 0.size 182 is the size of the first extent being defined when config 174 is specified and always starts at address 0. Size 182 is of the form nu (same syntax as for size 176 above). However, K is not a valid unit of measure for .size 182 with configuration 180

Address 184 is the starting address of an additional extent being defined, and is of the form nu (same syntax as for size 176 and 0.size 182). Subsequent extent start specifications 184 must specify a higher address than the ending address of the last extent plus one (contiguous extents are not valid).

.size 188 is the size of the extent being defined, and is also of the form nu (same syntax as for size 182, above).

If present, the optional modifier decr 186 specifies a value to be substracted from the extent starting address 184 specified to calculate the actual extent start address being defined. decr is of the form nnnnu, where nnnn is a one- to four-digit decimal number and u is the unit of measure (M, G, T, P, or E). -decr cannot be larger than address 184, cannot cause overlap or abutment of a previous extent specification, and its unit of measure u must be smaller than the one used for address 184. decrement 186 helps determine addresses of higher values, especially when they cross boundaries.

Figure 5:
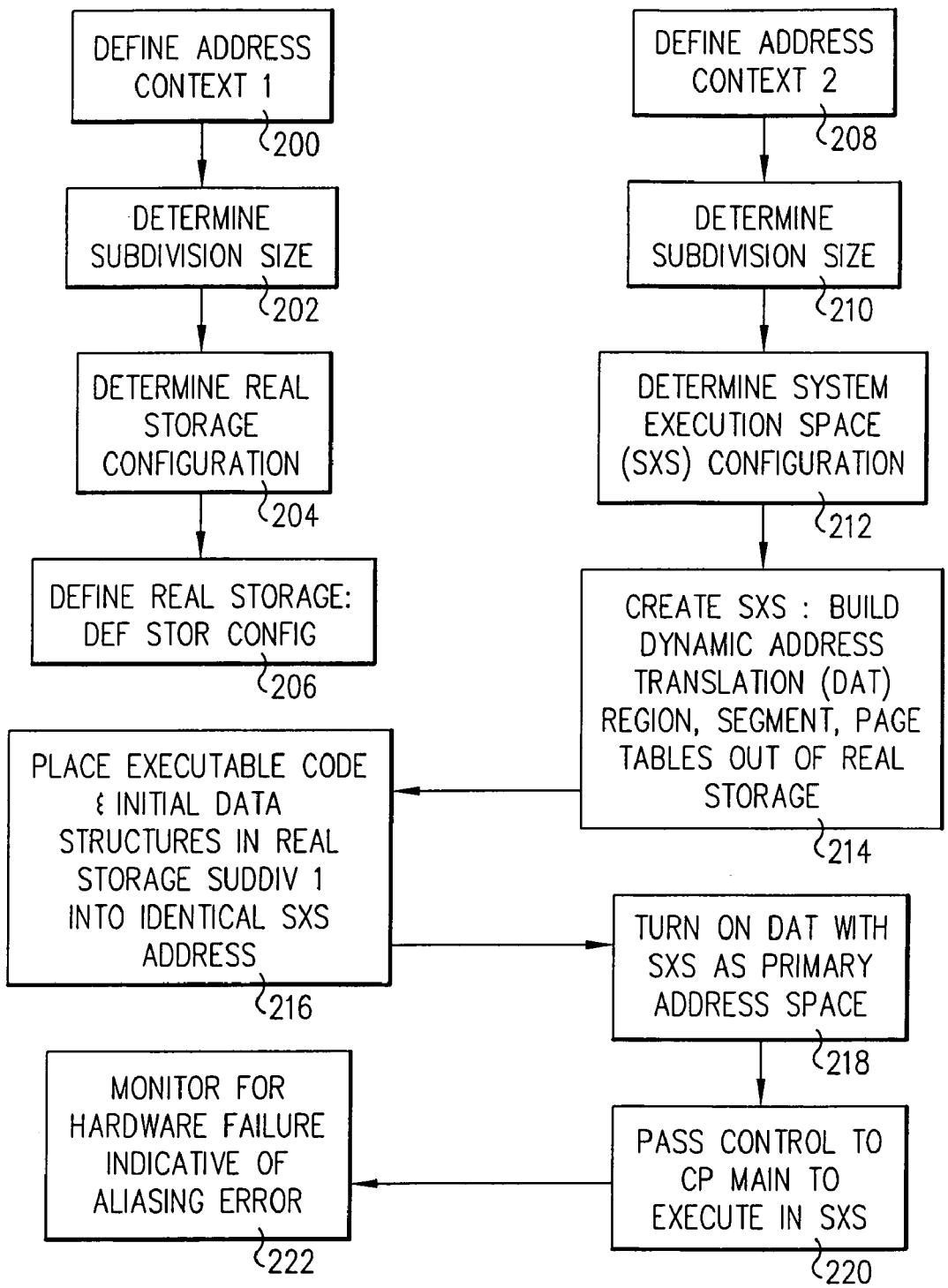
FIG. 5 is a flow chart representation of a best mode embodiment of the process of the present invention.
Figure 6:
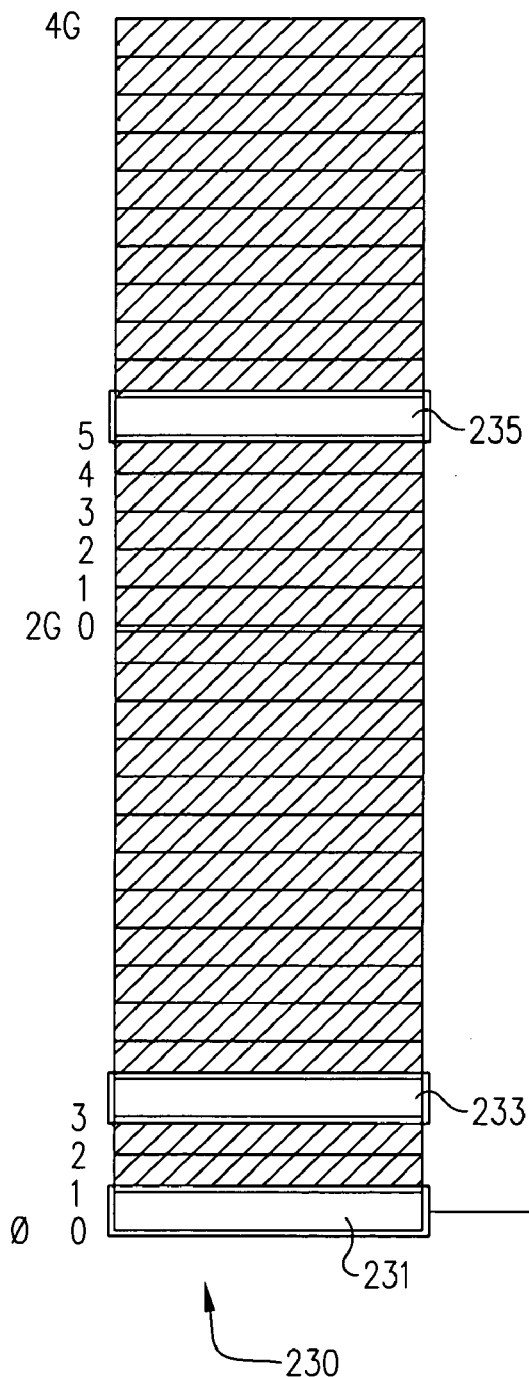
FIG. 6 is a diagrammatic representation of first and second storage contexts partitioned in accordance with an exemplary embodiment of the invention as set forth in FIG. 5.
Figure 6:
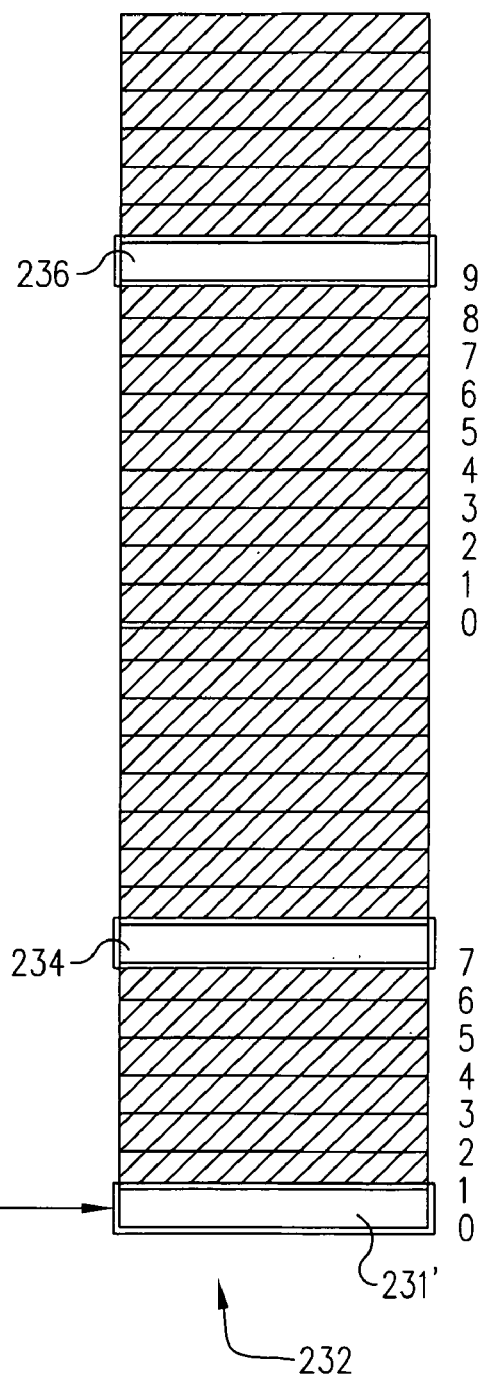
Figure 8:
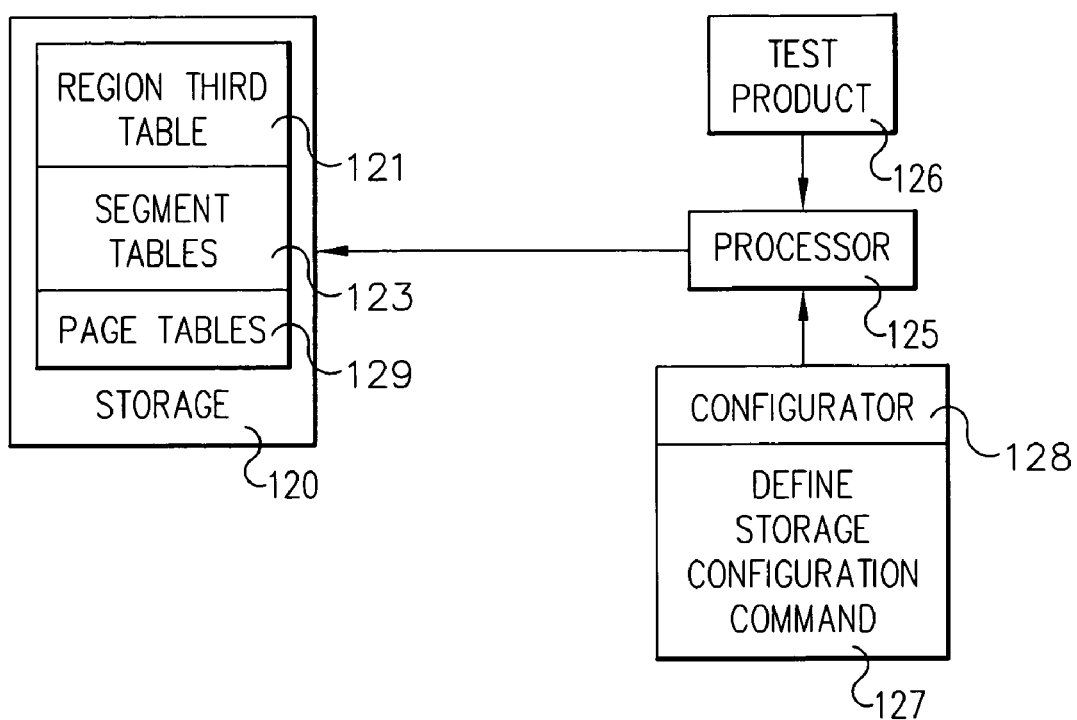
FIG. 8 is a high level system diagram illustrating various structures and objects of exemplary embodiments of the system of the invention.

Referring to FIG. 5 in connection with FIGS. 6 and 8, the method of the preferred embodiment of the invention is set forth. In this embodiment, the first context is real storage, as observed by the executing program (which may be a second-level operating system in a virtual machine), and the second context is the system execution space (SXS), a virtual storage address space in which the operating system will execute after initialization.

In FIG. 5, configurator 128 in steps 200-206 determines the storage configuration and defines the real storage configuration ultimately using DEF STOR CONFIG 127, and in steps 208-222 the running system (test product 126) interrogates the real storage configuration, adapts the SXS storage configuration to it, and so forth. While the configurator output is a real storage configuration, it is produced using information on all contexts. During system initialization the creation of the SXS is adaptive and adjusts to the real storage configuration using ranges left available by the configurator specifically for use in building the SXS.

Step 200 initializes the process executed by configurator 128 for defining first address context, which in this example is "real" storage 120, to the system 126 being tested (see FIG. 8).

In step 202, configurator 128 determines "subslice" (referred to in FIG. 5 as "subdivision") size. Subslices 231, 233 and 235 of first context 230 are illustrated in FIG. 6. Each subslice 231, etc., should fit evenly into a subslice of an extent (eg, 2 G), and its size depends on the addressing requirements of all address space contexts (that is, total number of 2 G extents of addressability in which addresses are to be valid, across both address space contexts 230, 232). Those requirements relate not so much to overall sizes of the two address spaces, but rather the address ranges in which storage should be addressable. In the example of FIG. 6, in the simplest case, addresses above 2 G and below 2 G are present and to be tested.

To be more complete, in an exemplary implementation, it may be needed to test with the following address ranges present:

0-2 G: 31-bit addresses, or bits 33-63 of a 64-bit address

2 G-4 G: 64-bit addresses, but the non-zero bits "fit" in the right half of a 64-bit register 4 G-up: 64-bit addresses, can only be represented or held by full 64-bit registers and fields.

In addition, "gaps" between valid sections may be required so that any code which "runs over" either end of the section of addresses it should be using will encounter a fault. In the example of FIG. 6, 16 sections are chosen, which determines the subslice size (step 202) to be 2 G/16.

In step 204, the configuration of real storage 230 (120 in FIG. 8) is determined and defined in step 206 by the DEF STOR CONFIG command. Each valid storage subslice 233 defined should have a different "subslice index" within its 2 G extent than any other valid storage subslice 235, defined within any other 2 G extent. Generally, extents are divided into slices, and the slices are divided into subslices to accommodate multiple contexts (address spaces).

In the simplest implementation, each storage extent 233, 235 should be less than or equal to the subslice size (in FIG. 6, these storage extents 233, 235 are shown as equal to subslice size, but they can be smaller than subslice size if desired.) However, complex implementations may require a contiguous range of valid addresses "occupying" more than one contiguous subslice. This is permissible as long as there are no overlaps in the subslice indices in use by other extents or contexts.

In the preferred embodiment, first storage extent 231 is defined starting at 0. This is the storage extent that will be "identity mapped" between the two address space contexts 230, 232 and contain the program being tested (CP) 126.

Additional extents 233, 235 are selected based on storage needs and testing goals: that is, are addresses below 2 G or above 2 G only to be tested, as illustrated here for simplicity, or those below 2 G, between 2 G and 4 G, or above 4 G, for example, to be tested.

The number of additional extents selected must leave enough unused subslices for other address space contexts to operate (for example, using no more than ¼ of the subslices for this definition allows plenty for the other address space context and for leaving "gaps" between the selected extents if desired.)

By way of example, in step 202 choose a subslice size of 2 G/16=128 M. In a simple implementation, each storage extent 231, 233, 235 defined will be 128 M or smaller in size, starting on a 128 M boundary. In this example, anti-aliased addresses both below 2 G and above 2 G are to be provided. An extent 231 is provided at first 128 M boundary location (starting at address 0) for CP. Then, to leave a gap, the next extent 233 below 2 G is defined at subslice index 3: 3*128=384, 0+384 M=384 M. Finally, to leave another gap, a final extent 235 above 2 G is defined at subslice 5 (the sixth subslice above the 2 G line): 5*128=640, 2 G=2048 M, 2048 M+640 M=2688 M The resulting DEFINE STORAGE CONFIG command of step 206 is:

DEF STOR CONFIG 0.128 M 384 M.128 M 2688 M.128 M

The resulting configuration of real storage, first context 230 is illustrated in FIG. 6, with non-addressable ranges hatched out (such ranges forming "gaps" in and interleaved with valid addresses 231, 233, and 235).

Having described the configurator with respect to steps 200-206, the test product initialization of steps 208-222 will next be described.

In step 208, the process for defining the layout of the second address context, or System Execution Space (SXS) virtual storage, to the system 126 being tested is done by early initialization code running in the system 126 being tested, before the System Execution Space is built.

In step 210, the "subslice" size is defined so as to fit evenly (that is, divide evenly, or fit an integral number of times with no remainder) into size of smaller address context (eg, 2 G). The size defined depends on the addressing requirements of the address space contexts (that is, total number of 2 G sections of addressability in which addresses are to be valid, across both address space contexts 230, 232), and further depends on the observed real storage 230 configuration resulting from step 206. This is done in step 212 by determining which real storage address extents are online and available. If the observed configuration is not suitable for anti-aliasing normal operation of test product 126 continues without setting up anti-aliasing. When anti-aliasing is configured, the process is adaptive in that it adjusts the configuration of the System Execution Space to accommodate the real storage configuration.

In step 210, the real storage 230 configuration is examined to determine a size and number of subslices that will work. There must be at least as many subslices in number as in the real configuration, but there may be more (provided an even multiple is selected). That is, 32 second context subslices could be selected when the real storage 230 configuration uses 16.

In step 212, the System Execution Space storage configuration is determined. With the exception of subslices to be identity mapped, for instance 231/231' described below, each storage extent 234, 236 defined may not have the same "subslice index" within its (2 G) extent as any other subslice 231, 231', 233, 235, 234, 236 already defined for either real storage 230 or System Execution Space storage 232.

In the simplest implementation, each storage extent 231', 234, 236 should be less than or equal to the subslice size (as above, a smaller than subslice size may be selected for these storage extents, if desired). Alternatively, according to a complex implementation, extents "occupying" more than one contiguous subslice may be defined (as above).

The first storage extent 231' is defined starting at 0. This is the storage extent that will be "identity mapped" between the two address space contexts 230, 232 and contain the program being tested (CP) 126.

Additional extents 234, 236 may be selected based on storage needs and testing goals: that is, are addresses to be tested below 2 G and above 2 G only, as illustrated here, or below 2 G, between 2 G and 4 G, and above 4 G. Further, gaps between allocated subslices may be provided in both address space contexts 230, 232.

In step 214, System Execution Space (SXS) is created by building appropriate Dynamic Address Translation (DAT) Region 121, Segment 123, and Page 129 tables in available real storage 230. (See the z/Architecture Principles of Operation reference for description of Region, Segment, and Page tables.)

Once DAT tables 121, 123, 129 are built, in step 216 the virtual addresses for subslice 0 in the System Execution Space 231' (addresses from 0 up to the size of the defined real storage extent) are mapped to the identical real addresses. This places all of the executable code and initial data structures of CP that already exist in real storage subslice 0 231 into the System Execution Space 231' at identical addresses. CP needs to operate in both contexts 230 and 232, and needs to have addressability in and to both contexts.

In step 218, the necessary register and control settings (PSW, Control Registers, etc.) to turn on Dynamic Address Translation (DAT) with the System Execution Space as the Primary address space (see the z Architecture reference) are turned on.

In step 220, control is transferred to the "main" portion of CP that will then execute within the System Execution space 231.

During execution (step 222), the hardware monitors for a reference to an invalid address indicative of an aliasing error.

By way of summary and example, in defining second context 232, a real storage (first context 230) is divided into 16 subslices per 2 G extent.

An anti-aliasing environment is possible where real extents do not have overlapping subslice indexes, and enough free subslice indexes for SXS creation are available. If these conditions are not determined processing continues to execute normally without anti-aliasing. In this example, a subslice size of 2 G/16=128 M is selected.

In accordance with an examplary embodiment, or simple implementation, assume in step 210 that real storage extents of 128 M or smaller in size are observed, starting on 128 M boundaries, and that anti-aliased addresses are to be tested both below 2 G and above 2 G. In step 212, an identity-mapped extent 231' of 128 M is established starting at storage location 0 in second context 232 for CP. Then, to find a next available subslice index, not in use by real storage 230 and allowing for gaps, real storage extents at indexes 3 and 5, are observed. With this information, a next extent 234 below 2 G in second context 232 is selected at subslice index 7:

7*128=896, 0+896 M=896 M

To locate a final extent 236, another gap is allowed (including subslices 6-8) and the extent established above 2 G at subslice 9:

9*128=1152 M 2 G=2048 M, 2048 M+1152 M=3200 M

The result is the second extent 232, or SXS, storage configuration (shown immediately following in DEF STOR CONFIG syntax for comparison):

0.128 M 896 M.128 M 3200 M.128 M

The final result is illustrated in FIG. 6, which shows the space definition for contexts 230 and 232, with non-addressable ranges hatched out, showing how no subslices overlap between below 2 G and above 2 G and between spaces (except for the identity-mapped subslice), enabling detection of erroneous alias mapping of all addresses from a plurality of or all 2 G extents into the same 2 G extent.

Figure 7:
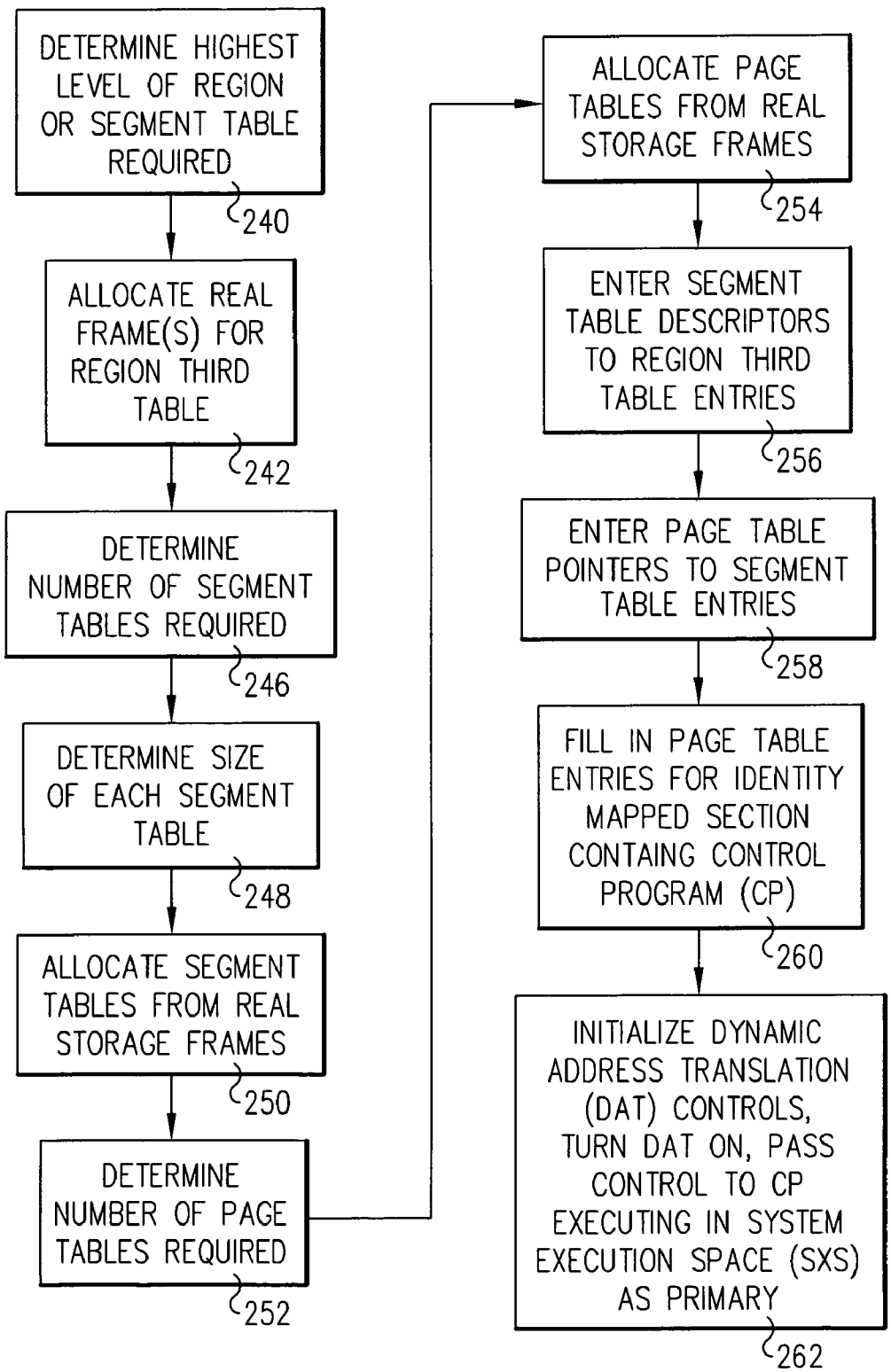
FIG. 7 is a flow chart representation of an exemplary embodiment for building the storage configuration of FIG. 6.

The detailed process for building the above storage configuration for System Execution Space 232 is described in the z/Architecture reference previously cited. Referring to FIG. 7, the main decision points in that process are illustrated. In step 240, the highest level of Region or Segment table required is determined. This depends on highest address to be defined:

3200 M+128 M can be described by a single one frame Region Third Table 121, and only requires the first two entries to be validated.

Consequently, in step 242, one real frame is allocated for the Region Third Table 121.

In step 246, the number of Segment Tables 123 required is determined. This will be the same as the number of 2 G "sections" (called "regions" in the architecture reference). Therefore, this example requires two Segment Tables 123.

In step 248, the size of each Segment Table required is determined. This is done, in this example, by choosing full sized four frame Segment Tables for simplicity. Consequently, in step 250, two four frame Segment Tables are allocated from available real storage frames (eight frames total).

In step 252, the number of Page Tables 129 required is determined. One Page Table 129 is needed per addressable Megabyte segment of System Execution Space virtual storage 232.

In step 254, Page Tables 129 are allocated from available real storage frames 230. In step 256, the first two Region Third Table 121 entries are filled in with descriptors for the two Segment Tables 123. In step 258, appropriate Segment Table 123 entries are filled in to point to Page Tables 129. In step 260, Page Table 129 entries are filled in for at least the identity mapped section 231' at subslice 1 (beginning at storage location 0), which contains CP.

In step 262, DAT controls are initialized, DAT started, and control is passed to CP executing in System Execution Space 232' as the primary address space.

ALTERNATIVE EMBODIMENTS

It will be appreciated that, although specific embodiments of the invention have been described herein for purposes of illustration, various modifications may be made without departing from the spirit and scope of the invention.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, or store the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Accordingly, the scope of protection of this invention is limited only by the following claims and their equivalents.

What is claimed is:

1. A method for testing program code for detecting and correcting aliasing errors, comprising:
    dividing storage into a plurality of extents;
    dividing each said extent into subdivisions;
    defining gaps in valid addresses in said storage such that when an address of a subdivision in one extent is valid, addresses in corresponding subdivisions of other extents are invalid;

issuing an exception upon detecting a reference to an address within a gap; and responsive to said exception, correcting said reference to reference an address which is not within a gap.

2. The method of claim 1, wherein said address references a gap in said any other extents if said address comprises at least one of a missing bit, an extra bit, and use of an erroneous addressing mode.

3. The method of claim 1, wherein valid addresses reference a first slice of a first extent and a second slice of a second extent, and further comprising;

defining address references to other slices in said first and second extents as being invalid.

4. The method of claim 1, further comprising defining a first address context by:

determining and defining for said first address context a storage configuration with each subdivision which contains valid addresses having a subdivision index within its extent different from a subdivision index for any other extent which contains valid addresses within any other extent.

5. The method of claim 4, wherein said first address context is real storage.

6. The method of claim 4, further comprising defining a second address context by:

determining and defining a storage configuration within said second address context with one or more of each subdivision which contains valid addresses having a subdivision index within its extent different from a subdivision index for any other subdivision which contains valid addresses within any other extent of said first address context and said second address context.

7. The method of claim 6, further comprising:

adaptively enabling anti-aliasing to adjust configuration of system execution space to accommodate real storage configuration; and configuring said second address context based on observed first address context storage configuration.

8. The method of claim 7, further comprising creating said first or second address context by building dynamic address translation region, segment, and page tables out of real storage.

9. The method of claim 8, further comprising:

placing executable code and initial data structures in an identity mapped subregion of said first and said second address context;

executing dynamic address translation with said second address context as primary address space;

passing control to a control program to execute in said selected subdivision; and monitoring for hardware failure indicative of aliasing error.

10. A computer program product for detecting aliasing errors, said computer program product comprising:

a computer readable storage medium;

first program instructions to divide a storage into a plurality of extents;

second program instructions to divide each said extent into subdivisions;

third program instructions to define gaps in valid addresses in said storage such that when an address of a subdivision in one extent is valid, addresses in corresponding subdivisions of other extents are invalid; and fourth program instructions to issue an exception upon detecting a reference to an address within a gap; and wherein said first, second, third and fourth program instructions are stored on said computer readable storage medium.

11. The computer program product of claim 10, wherein said address references a gap in said other extents if said address comprises at least one of a missing bit, and extra bit, and use of an erroneous addressing mode.

12. The computer program product of claim 10, wherein valid addresses reference a first slice of a first extent and a second slice of a second extent, and further comprising fifth program instructions to define address references to other slices in said first and second extents as being invalid; and wherein said fifth program instructions are stored on said computer readable storage medium.

13. The computer program product of claim 10, further comprising fifth program instructions to define a first address context by:

determining and defining for said first address context a storage configuration with each subdivision which contains valid addresses having a subdivision index within its extent different from a subdivision index for any other extent which contains valid addresses within any other extent; and wherein said fifth program instructions are stored on said computer readable storage medium.

14. The computer program product of claim 13, wherein said first address context is real storage.

15. The computer program product of claim 13, further comprising fifth program instructions to define a second address context by:

determining and defining a storage configuration within said second address context with one or more of each subdivision which contains valid addresses having a subdivision index within its extent different from a subdivision index for any other subdivision which contains valid addresses within any other extent of said first address context and said second address context; and wherein said fifth program instructions are stored on said computer readable storage medium.

16. The computer program product of claim 13, further comprising:

fifth program instructions to adaptively enable anti-aliasing; and sixth program instructions to configure said second address context based on observed first address context storage configuration; and wherein said fifth and sixth program instructions are stored on said computer readable storage medium.

17. The computer program product of claim 16, further comprising seventh program instructions to create said first or second address context by building dynamic address translation region, segment, and page tables out of real storage; and wherein said seventh program instructions are stored on said computer readable storage medium.

* * * * *